United States Patent
Singh et al.

(10) Patent No.: US 9,503,062 B2
(45) Date of Patent: Nov. 22, 2016

(54) SEMICONDUCTOR CIRCUIT AND SEMICONDUCTOR SYSTEM

(71) Applicants: Rahul Singh, Yongin-si (KR); Min-Su Kim, Hwaseong-si (KR); Chung-Hee Kim, Yongin-si (KR)

(72) Inventors: Rahul Singh, Yongin-si (KR); Min-Su Kim, Hwaseong-si (KR); Chung-Hee Kim, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 47 days.

(21) Appl. No.: 14/339,914

(22) Filed: Jul. 24, 2014

(65) Prior Publication Data
US 2015/0102847 A1 Apr. 16, 2015

(30) Foreign Application Priority Data
Oct. 16, 2013 (KR) .................. 10-2013-0123398

(51) Int. Cl.
H03K 3/00 (2006.01)
H03K 3/037 (2006.01)

(52) U.S. Cl.
CPC .......... *H03K 3/0375* (2013.01); *H03K 3/0372* (2013.01)

(58) Field of Classification Search
CPC ............... H03K 3/012; H03K 3/0372; H03K 3/0375; H03K 3/35625; H03K 3/289
USPC ............... 327/202, 203, 208, 210, 212, 218
See application file for complete search history.

(56) References Cited

U.S. PATENT DOCUMENTS

| | | | |
|---|---|---|---|
| 4,691,122 A | | 9/1987 | Schnizlein et al. |
| 6,100,727 A | * | 8/2000 | Nomura .................. 327/108 |
| 6,204,708 B1 | | 3/2001 | Alexander |
| 6,404,253 B1 | | 6/2002 | Hwang et al. |
| 6,617,892 B2 | * | 9/2003 | Krishnamurthy et al. ... 327/112 |
| 7,123,068 B1 | * | 10/2006 | Hoover et al. ............. 327/202 |
| 7,248,090 B2 | | 7/2007 | Ramprasad |
| 7,408,393 B1 | | 8/2008 | Jain et al. |
| 8,416,002 B2 | * | 4/2013 | Liu et al. .................. 327/211 |
| 2005/0206421 A1 | * | 9/2005 | Nishikawa et al. ......... 327/203 |
| 2008/0024184 A1 | | 1/2008 | Wang |
| 2008/0186070 A1 | | 8/2008 | Iyer et al. |
| 2009/0058485 A1 | * | 3/2009 | Berzins et al. ............. 327/203 |
| 2009/0256608 A1 | * | 10/2009 | Djaja et al. ................ 327/202 |
| 2010/0264972 A1 | | 10/2010 | Chi et al. |
| 2012/0146697 A1 | | 6/2012 | Leach et al. |

FOREIGN PATENT DOCUMENTS

| | | | |
|---|---|---|---|
| JP | 07-131302 A | | 5/1995 |
| JP | 2004343499 A | * | 12/2004 |
| KR | 1020060041831 A | | 5/2006 |

* cited by examiner

*Primary Examiner* — Quan Tra
(74) *Attorney, Agent, or Firm* — Harness, Dickey & Pierce, P.L.C.

(57) ABSTRACT

An example embodiment discloses a flip-flop including a first inverter configured to invert first data, first and second transistors connected to each other in series and configured to receive the inverted first data and a first clock, respectively, a third transistor and a first gate configured to perform a logic operation on the first data and the first clock, the third transistor configured to receive an output of the logic operation. The second transistor and the third transistor are connected to a first node.

13 Claims, 14 Drawing Sheets

FIG. 4

| CK1 | ID | MCK1 |
|---|---|---|
| 0 | 1 | 0 |
| 1 | 1 | 0 |
| 1 | 0 | 0 |
| 0 | 0 | 1 |

| CK1 | ID | MASTER STAGE | SLAVE STAGE |
|---|---|---|---|
| 0 | 1 | ENABLE | DISABLE |
| 1 | 1 | DISABLE | ENABLE |
| 0 | 0 | ENABLE | DISABLE |
| 1 | 0 | DISABLE | ENABLE |

SEMICONDUCTOR CIRCUIT AND SEMICONDUCTOR SYSTEM

CROSS-REFERENCE TO RELATED APPLICATIONS

This application is based on and claims priority from Korean Patent Application No. 10-2013-0123398, filed on Oct. 16, 2013 in the Korean intellectual Property Office, the disclosure of which is incorporated herein in its entirety by reference.

BACKGROUND

1. Field of Inventive Concepts

Inventive concepts relate to semiconductor circuits and a semiconductor systems.

2 Description of the Prior Art

As one of semiconductor devices, a flip-flop operates to store input data in response to a clock signal and to sequentially transfer the stored data. A plurality of flip-flops may be used to transfer data.

On the other hand, with the trend of high-speed electronic products, the speed of a clock signal that is provided to a flip-flop has been gradually increased. In order to reliably operate a plurality of flip-flops in this environment, it is required that timing fail does not occur during the operation of the flip-flops regardless of the high-speed clock signal.

SUMMARY

Inventive concepts provide a semiconductor circuit in which a sampling window is symmetrically formed with a small size and thus product reliability is improved.

Also, inventive concepts provide a semiconductor system in which a sampling window is symmetrically formed with a small size and thus product reliability is improved.

Additional advantages, subjects, and features of inventive concepts will be set forth in part in the description which follows and in part will become apparent to those having ordinary skill in the art upon examination of the following or may be learned from practice of the inventive concept.

In one example embodiment of inventive concepts, there is provided a flip flop, the flip flop comprises a first inverter configured to invert first data; first and second transistors connected to each other in series and configured to receive the inverted first data and a first clock, respectively; a third transistor; and a first gate configured to perform a logic operation on the first data and the first clock, the third transistor configured to receive an output of the logic operation, wherein the second transistor and the third transistor are connected to a first node.

In one example embodiment of inventive concepts, there is provided a semiconductor circuit, the semiconductor circuit comprises a master circuit and a slave circuit configured to receive a first clock and a second clock, respectively, the first clock and second clock having different phases from each other, wherein the master circuit includes, a first transistor, a second transistor, and a third transistor connected in series between a first voltage terminal and a second voltage terminal, and a first inverter configured to invert input data and gate the first transistor, and a first gate gating the third transistor, the first gate configured to perform a logic operation on the input data and the first clock, wherein the second transistor is configured to receive the first clock.

In one example embodiment of inventive concepts, there is provided a semiconductor system, the semiconductor system comprises a transmitter configured to transmit first data using a reference clock; and a receiver configured to receive the first data, wherein the receiver includes, a clock generating unit configured to generate a first clock and a second clock having different phases using the reference clock; a master circuit configured to receive the first data and the first clock and outputting second data; and a slave circuit configured to receive the second data and the second clock and output third data, wherein the master circuit includes a first circuit between a first voltage terminal and a first node to change the second data to a first level, and a second circuit between the first node and a second voltage terminal to change the second data to a second level, and the second circuit is configured to operate according to a logic operation signal of the first data and the second clock.

In another example embodiment of inventive concepts, there is provided a semiconductor circuit, the semiconductor circuit comprises a clock generating unit configured to generate a first clock and a second clock that is different from the first clock using a reference clock; a master circuit configured to receive first data and the first clock and output second data and a slave circuit configured to receive the second data and the second clock and output third data, wherein the second clock includes a first sub-clock and a second sub-clock, and the master circuit includes, a first PMOS transistor connected to a power supply voltage; a second PMOS transistor connected in series to the first PMOS transistor and gated by the first clock; a first NMOS transistor connected in series to the second PMOS transistor and connected to a ground voltage terminal; a first inverter configured to gate the first PMOS transistor by in input data; and a NOR gate configured to gate the first NMOS transistor by performing a NOR logic operation of the first clock and the input data, and the clock generating unit includes: a delay unit configured to delay a phase of the reference clock to generate the first clock; a NAND gate configured to perform a NAND logic operation of the first clock and the reference clock to generate the first sub-clock; and a second inverter configured to invert the first sub-clock to generate the second sub-clock.

At least one example embodiment discloses a clock generating circuit configured to generate a first clock and a second clock, a master circuit configured to receive first data, perform a logical operation on the first clock and first data, and generate first output data based on the logical operation and a slave circuit configured to generate second output data based on the first output data and the second clock.

BRIEF DESCRIPTION OF THE DRAWINGS

The above and other objects, features and advantages of inventive concepts will be more apparent from the following detailed description taken in conjunction with the accompanying drawings, in which:

FIGS. 3 and 4 are diagrams explaining the operation of a semiconductor circuit according to an example embodiment of inventive concepts.

DETAILED DESCRIPTION OF EXAMPLE EMBODIMENTS

Figure 1:
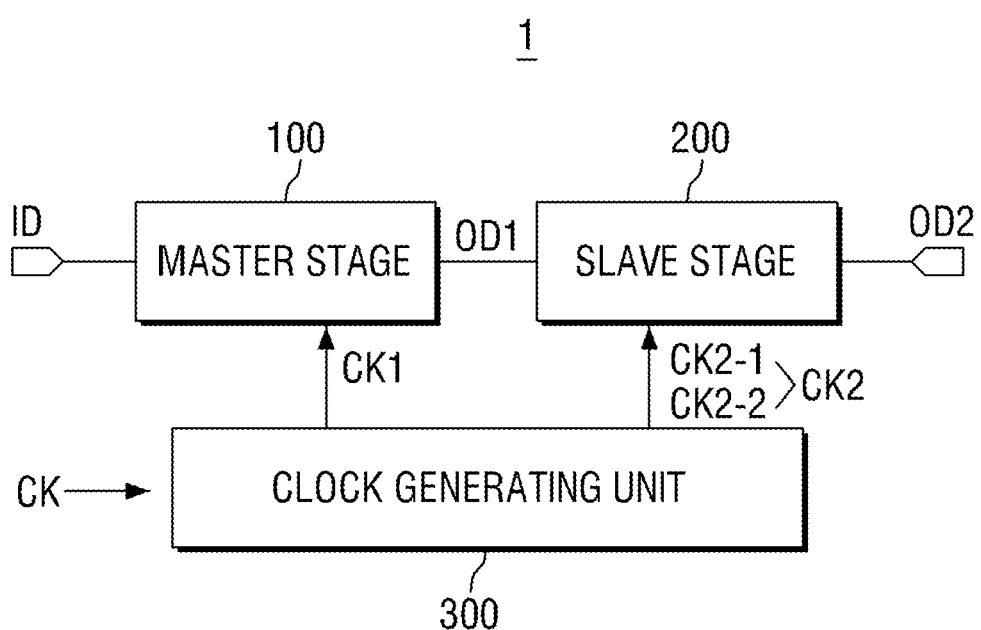
FIG. 1 is a block diagram of a semiconductor circuit according to an example embodiment of inventive concepts.

Inventive concepts will now be described more fully hereinafter with reference to the accompanying drawings, in which example embodiments of inventive concepts are shown. Inventive concepts may, however, be embodied in different forms and should not be construed as limited to example embodiments set forth herein. Rather, example embodiments are provided so that this disclosure will be thorough and complete, and will filly convey the scope of inventive concepts to those skilled in the art. The same reference numbers indicate the same components throughout the specification. In the attached figures, the thickness of layers and regions is exaggerated for clarity.

The use of the terms "a" and "an" and "the" and similar referents in the context of describing inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which inventive concepts belong. It is noted that the use of any and all examples, or terms provided herein is intended merely to better illuminate inventive concepts and is not a limitation on the scope of inventive concepts unless otherwise specified. Further, unless defined otherwise, all terms defined in generally used dictionaries may not be overly interpreted.

Inventive concepts will be described with reference to perspective views, cross-sectional views, and/or plan views, in which example embodiments of inventive concepts are shown. Thus, the profile of an exemplary view may be modified according to manufacturing techniques and/or allowances. That is, example embodiments of inventive concepts are not intended to limit the scope of inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, a semiconductor circuit 1 according to an example embodiment of inventive concepts will be described with reference to FIGS. 1 and 2.

Figure 2:
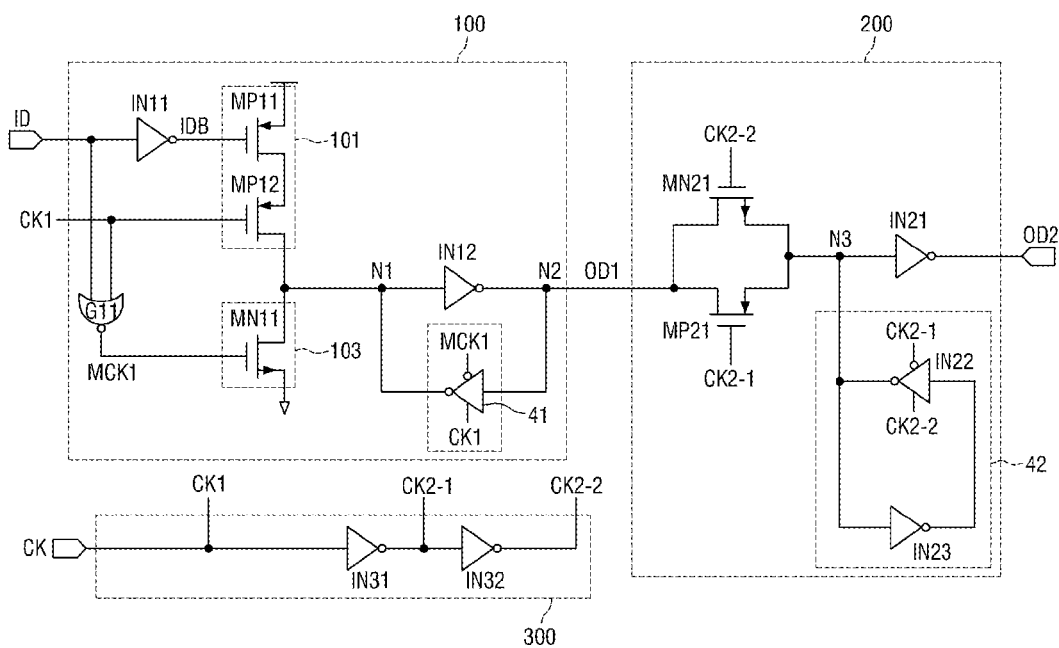
FIG. 2 is a circuit diagram of a semiconductor circuit according to an example embodiment of inventive concepts.

FIG. 1 is a block diagram of a semiconductor circuit 1 according to an example embodiment of present inventive concepts, and FIG. 2 is a circuit diagram of the semiconductor circuit 1 according to an example embodiment of inventive concepts.

Referring to FIG. 1, the semiconductor circuit 1 includes a master stage 100, a slave stage 200, and a clock generating unit 300.

For example, the semiconductor circuit 1 may receive input data and perform sampling of the received data. However, inventive concepts are not limited thereto. Hereinafter, it is exemplified that the semiconductor circuit 1 is a master slave flip-flop. However, inventive concepts are not limited thereto, and the technical concept of inventive concepts can be modified and applied to other semiconductor circuits without limit.

The master stage 100 receives first data ID and a first clock CK1. The master stage 100 may receive the first data. ID based on the first clock CK1 and output second data OD1. The first clock CK1 may be provided from the clock generating unit 300.

The slave stage 200 receives a second clock CK2 and the second data OD1. The slave stage 200 may receive the second data OD1 based on the second clock CK2 and output third data OD2. In this example embodiment, the second clock CK2 may also be provided from the clock generating unit 300. Here, the first data ID may be input data that is input to the semiconductor circuit 1, the second data OD1 may be first output data that is output from the master stage 100, and the third data OD2 may be second output data that is output from the slave stage 200.

On the other hand, the second clock CK2 that is provided to the slave stage 200 may include a first sub-clock CK2-1 and a second sub-clock CK2-2. The master stage 100 may use the first clock CK1 and a logic operation signal MCK1 that is obtained by performing a logic operation of the first clock CK1 and the first data ID, and this will be described later. Hereinafter, a configuration that divides the second clock CK2 into a plurality of sub-clocks and applies the divided sub-clocks to the slave stage 200 will be described, but inventive concepts are not limited thereto.

Referring to FIG. 2, the master stage 100 may include, for example, a first circuit 101, a second circuit 103, a first inverter IN11, a first gate G11, a second inverter IN12, and a first keeper 41.

The first circuit 101 and the second circuit 103 are connected in series around a first node N1. The first circuit 101 is connected to a first voltage terminal, and the second circuit 103 is connected to a second voltage terminal. For example, the first voltage may be a power supply voltage, and the second voltage may be a ground voltage, but are not limited thereto.

The first circuit 101 may be formed by connecting a first transistor MP11 and a second transistor MP12 in series. The second circuit 103 may include a third transistor MN11. For example, the first transistor MP11 may be a PMOS transistor, the second transistor MP12 may be a PMOS transistor, and the third transistor MN11 may be an NMOS transistor. The first circuit 101 may receive the first data ID and the first clock CK1, and may change the second data OD1 through the received data. The second circuit 103 may receive a logically operated signal through a first gate G11 to operate, and may change the second data OD1. Specifically, the first circuit 101 may change the second data OD1 to a first level, and the second circuit 103 may change the second data OD1 to a second level. For example, the first level may be a logical low level, and the second level may be a logical high level. The detailed contents thereof will be described later.

The first inverter IN11 inverts the first data ID and generates inverted data IDB. The first data ID may be, for example, input data that the master stage 100 receives. The first inverter IN11 may be connected to the first transistor MP11, and the inverted data IDB of the first data ID may be provided to the first transistor MP11. The inverted data IDB may gates the first transistor MP11.

The second transistor MP12 may receive the first clock CK1 and may be gated by the first clock CK1.

The first gate G11 receives the first data ID and the first clock CK1. The first gate G11 generates a logic operation signal MCK1 by performing first logic operation of the received first data ID and first clock CK1, and provides the generated logic operation signal MCK1 to the third transistor MN11. The first gate G11 may be, for example, a NOR gate. Accordingly, the first logic operation may be a NOR logic operation. The logic operation signal MCK1 may gate the third transistor MN11.

The second inverter IN12 may be connected between the first node N1 and a second node N2. The second inverter IN12 may invert a signal of the first node N1 and output the inverted signal to the second node N2, and the output signal may be the second data OD1.

A first keeper 41 may be connected between the first node N1 and the second node N2. The first keeper 41 may be connected to the second inverter IN12 in parallel. The first keeper 41 may operate using the first clock CK1 and the logic operation signal MCK1. The first keeper 41 may latch the second data OD1. Accordingly, the second data OD1 may be kept constant without being externally interfered.

The slave stage 200 may include a fourth transistor MN21, a fifth transistor MP21, a second keeper 42, and a third inverter IN21.

The fourth transistor MN21 and the fifth transistor MP21 may be connected in parallel between the second node N2 and a third node N3. For example, the fourth transistor MN21 may be an NMOS transistor, and the fifth transistor MP21 may be a PMOS transistor. The fourth transistor MN21 may be gated by the second sub-clock CK2-2, and the fifth transistor MP21 may be gated by the first sub-clock CK2-1. The fourth transistor MN21 and the fifth transistor MP21 may determine whether to transfer the second data OD1 to the third node N3.

The third inverter IN21 is connected to the third node N3 and inverts a signal that is transferred to the third node N3. The inverted signal that is inverted by the third inverter IN21 may be the third data OD2.

The second keeper 42 may be connected to the third node N3. The second keeper 42 may include a fourth inverter IN22 and a fifth inverter IN23. The fourth inverter IN22 and the fifth inverter IN23 may be connected in series, and the fourth inverter IN22 may receive the first sub-clock CK2-1 and the second sub-clock CK2-2 to operate. The second keeper 42 may latch the signal that is provided to the third node N3.

Referring again to FIG. 1, the clock generating unit 300 may receive a reference clock CK, and venerate the first clock CK1 and the second clock CK2 from the reference clock CK. The second clock CK2 may include the first sub-clock CK2-1 and the second sub-clock CK2-2.

In this example embodiment, the first clock CK1 and the second clock CK2 may be different from each other. In other words, the phase of the first clock CK1 may be different from the phase of the second clock CK2. Specifically, the first clock CK1 and the second clock CK2 may be generated so that at least one of edges of the first clock CK1 and the second clock CK2 becomes a non-overlap edge. More specifically, the first clock CK1 and the second clock CK2 may be generated so that the first edge of the first clock CK1 does not overlap the first edge of the second clock CK2 and at least a part of the second edge of the first clock CK1 overlaps the second edge of the second clock CK2. For example, the first edge may be a rising edge RE and the second edge may be a falling edge FE, but are not limited thereto. The first edge may be a falling edge and the second edge may be a rising edge.

Referring to FIG. 2, the clock generating unit 300 may include sixth inverter IN31 and a seventh inverter IN32.

In the semiconductor circuit 1 of FIG. 2, the first clock CK1 may be the same as the reference clock CK. Accordingly, the clock generation unit 300 may provide the reference clock CK to the master stage 100 as it is.

The first sub-clock CK2-1 may be generated through inversion of the reference clock CK by the sixth inverter IN31. Further, the second sub-clock CK2-2 may be generated through inversion of the first sub-clock CK2-1 by the seventh inverter IN32.

Figure 3:
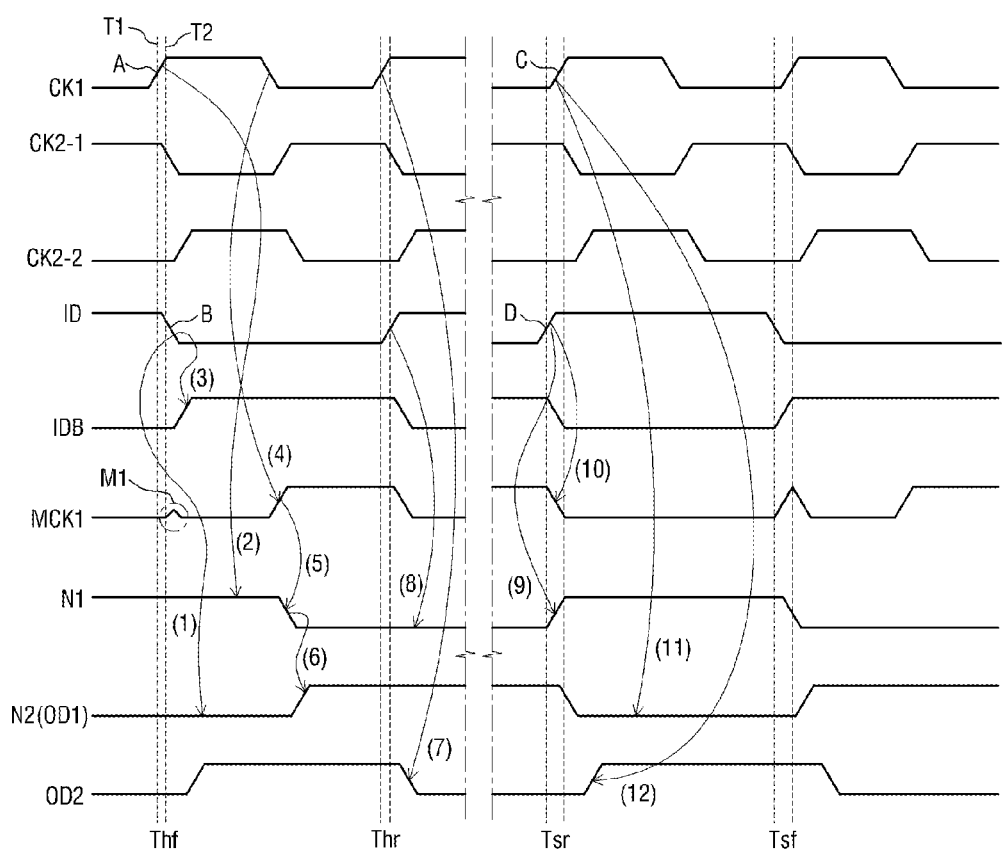

Referring to FIGS. 3 and 4, the operation of the semiconductor circuit 1 according to an example embodiment of inventive concepts will be described.

FIGS. 3 and 4 are diagrams explaining the operation of the semiconductor circuit 1. FIG. 3 is a diagram illustrating the operation timing of the semiconductor circuit 1, and FIG. 4 is a diagram illustrating outputs of the first gate G11 according to inputs thereof.

Prior to the detailed explanation of the operation of the semiconductor circuit 1, several wordings that can indicate the operating characteristics of a flip-flop circuit will be described.

First, a sampling window Tsw means a time for which an input signal should be kept in order for the flip-flop circuit to read the data value of the input signal. This sampling window may be expressed in Equation 1 below.

$$\text{Sampling window } (T\text{sw}) = \text{data setup time } (T\text{setup}) + \text{data hold time } (T\text{hold}) \quad \text{[Equation 1]}$$

Here, the data setup time Tsetup means a time that should be pre-provided in order for the flip-flop circuit to accurately read the data value from the input signal. That is, the data setup time Tsetup is an index indicating the time that is required for the flip-flop circuit to prepare a read operation before the clock signal is applied so that the flip-flop circuit can accurately read the data value from the input signal.

In inventive concepts, the data setup time Tsetup means the time that should be pre-provided in order to accurately read the value of the first data ID when the second data OD1 is changed by the first data ID. The data setup time Tsetup may include a data setup rising time Tsr and a data setup falling time Tsf. The data setup rising time Tsr means a time that should be provided in order to accurately read the rising edge RE of the first data ID, that is, in order to accurately read a logical high level, and the data setup falling time Tsf means a time that should be provided in order to read the falling edge FE of the first data ID, that is, in order to accurately read a logical low level.

Referring to FIG. 3, it can be seen that when the first data ID is changed to the logical high level or logical low level at the data setup rising time Tsr and the data setup falling time Tsf, the second data OD1 is changed.

For example, as for the data setup rising time Tsr, the logical high level of the first data ID should be read when the first clock CK1 is applied. When the first clock CK1 has a constant value C or more, the rising edge RE of the first data ID should also have a constant value D enough to read the logical high level. Accordingly, in FIG. 3, the time between C and D may be considered as the data setup rising time Tsr. Since the data setup falling time Tsf can be analogized from the data setup rising time Tsr, the explanation thereof will be omitted.

On the other hand, the data hold time Thold means a time for which the input signal should be kept in order for the flip-flop circuit to accurately read the data value from the input signal. That is, the data hold time Thold is an index indicating the time for which the input signal should be kept after the clock signal is applied so that the flip-flop circuit can accurately read the data value from the input signal.

In inventive concepts, the data hold time Thold means the time for which the first data ID should be kept in order to accurately read the value of the first data ID for keeping the second data OD1 constant. The data hold time Thold may include a data hold rising time Thr and a data hold filling time Thf. The data hold rising time Thr means a time for which the first data ID should be kept in order to accurately read the logical low level just before the rising edge RE of the first data ID is generated, and the data hold falling time Thf means a time for which the first ID should be kept in order to accurately read the logical high level just before the falling edge FE of the first data ID is generated.

Referring to FIG. 3, it can be seen that even if the first data ID, of which the data hold rising time Thr and the data hold falling time Thf are illustrated, is changed to the logical high level or logical low level, the second data OD1 is kept constant.

For example, as for the data hold falling time Thf, the logical high level of the first data ID should be read when the first clock CK1 is applied. When the first clock CK1 has a constant value A or more, the falling edge FE of the first data ID should keep a constant value B or more enough to read the logical high level. Accordingly, in FIG. 3, the time between A and B may be considered as the data hold falling time Thf. Since the data hold rising time Thr can be analogized from the data hold falling time Thf, the explanation thereof will be omitted.

In the semiconductor circuit 1 according to an example embodiment of inventive concepts, a high sampling window Tsw_high may be obtained from the sum of the data setup rising time Tsr and the data hold falling time Thf, and a low sampling window Tsw_low may be obtained from the sum of the data setup falling time Tsf and the data hold rising time Thr. In other words, the high sampling window Tsw_high means the sum of the time that should be provided to read the level of the first data ID as the logical high level and the time for which the level of the first data ID should be kept the logical high level.

On the other hand, the low sampling window Tsw_low means the sum of the time that should be provided to read the level of the first data ID as the logical low level and the time for which the level of the first data ID should be kept the logical low level.

In a general flip-flop circuit, as the size of the sampling window becomes smaller, the flip-flop circuit can operate at higher speed.

Referring to FIGS. 3 and 4, if the first data ID is applied to the master stage 100, the first data ID is directly output as the second data OD1 through the master stage 100 (operation (1)). Specifically, since the level of the first clock CK1 becomes the logical high level when the level of the first data ID is the logical low level, the first transistor MP11 and the second transistor MP12 are all turned on. However, the third transistor MN11 is kept in a turn-off state. Accordingly, the first node N1 is kept at high level, and as a result, the second data OD1 is kept at a first level (logical low level) (operation (2)).

Since the level of the first clock CK1 is the logical high level, the level of the first sub-clock CK2-1 becomes the logical low level, and the level of the second sub-clock CK2-2 becomes the logical high level. Since the first sub-clock CK2-1 is generated by the sixth inverter IN31, the phase of the first sub-clock CK2-1 is delayed for a time in comparison to the phase of the first clock CK1. Since the second sub-clock CK2-2 is generated by the seventh inverter IN32, the phase of the second sub-clock CK2-2 is delayed for a time in comparison to the phase of the first sub-clock CK2-1. Since such a relationship between the reference clock CK and the first and second sub-clocks CK2-1 and CK2-2 can be analogized from the configuration of the clock generating unit 300 as described above, the detailed explanation thereof will be omitted.

On the other hand, if the first sub-clock CK2-1 is at the logical high level and the second sub-clock CK2-2 is at the logical low level as described above, the fourth transistor MN21 and the fifth transistor MP21 are turned off, and the slave stage 200 is in a disable state. Accordingly, the first data ID is unable to be latched onto the slave stage 200.

Then, if the rising edge RE of the first clock CK1 is formed, the second transistor MP12 is turned off. However, the level of the logic operation signal MCK1 that is generated by the first gate G11 is kept the logical low level. Accordingly, the third transistor MN11 is still in the turn-off state, the first node N1 is kept at the logical high level.

Since the rising edge RE of the first clock CK1 is formed, the first and second sub-clocks CK2-1 and CK2-2 have the falling edge FE and the rising edge RE, respectively. Thus, the slave stage 200 is enabled. Accordingly, the second data OD1 is provided to the slave stage 200, and the third inverter IN21 inverts the second data OD1 to output the third data. The third data OD2 may be at the logical high level.

Then, if the falling edge FE of the first data ID is formed, a rising edge RE of an inverted data IDB, which is generated by delaying the first data ID for a time through the first inverter IN11, is formed (operation (3)). The inverted data IDB is kept at the logical high level to turn off the first transistor MP11. However, since the logic operation signal MCK1 is still at the logical low level, the third transistor MN11 is in the turn-off state, and thus the second data OD1 is kept at the logical low level.

On the other hand, since the rising edge RE of the first clock CK1 and the falling edge FE of the first data ID partially overlap each other, partial modification M1 may occur in the logic operation signal MCK1. However, such partial modification does not exert an influence on the third transistor NM11. Further, the partial modification M1 may not occur.

Then, if the falling edge FE of the first clock CK1 is formed, the rising edge RE of the logic operation signal MCK1 may be formed (operation (4)). By means of the logic operation signal MCK1, the third transistor MN11 is turned on, and the first node N1 is changed to the logical low level (operation (5)). Accordingly, the second data OD1 is delayed for a time by the second inverter IN12, and is changed to the logical high level (operation (6)). As a result, the first data ID may be output as the first data ID at the falling edge FE of the first clock CK1.

If the falling edge FE of the first clock CK1 is formed, the slave stage 200 is disabled, and is unable to latch the second data OD1. Accordingly, the third data OD2 is kept at the logical high level.

On the other hand, referring to FIG. 4, it can be known that the logic operation signal MCK1 is at the logical high level only when the first clock CK1 and the first data ID are all at the logical low level.

Referring again to FIG. 3, if the rising edge RE of the first clock CK1 is formed in a state where the first data ID is kept at the logical low level, the first transistor MP11, the second transistor MP12, and the third transistor MN11 are all turned off, and the master stage 10 is disabled. Accordingly, the second data OD1 is kept at the logical high level. Further, if the rising edge RE of the first clock CK1 is formed, the slave stage 200 is enabled. The slave stage 200 receives the second data OD1 of the logical high level, and forms the falling edge FE of the third data OD2. As a result, at the rising edge RE of the first clock CK1, the slave stage 200 reads the first data ID and outputs the read first data ID as the third data OD2 (operation (7)).

Then, if the rising edge RF of the first data ID is formed, the first transistor MP11 is turned on, but the second transistor MP12 and the third transistor MN11 are still in a turn-off state. Accordingly, the master stage 100 is in a disabled state, and the second data OD1 is kept constant (operation (8)). Since the first clock CK1 is at the logical high level, the slave stage 200 is enabled, and the third inverter IN21 inverts the second data OD1 and outputs the inverted second data as the third data OD2.

Next, if the first clock CK1 is at the logical low level and the first data ID is at the logical low level, the first transistor MP11 is turned off. At this time, since the logic operation signal MN11 is at the logical high level, the third transistor MN11 is turned on, and the first node N1 is at the logical low level. Accordingly, the second data OD1 is at the logical high level. However, since the first clock CK1 is at the logical low level, the slave stage 200 is disabled, and thus the slave stage 200 is unable to latch the second data OD1.

If the rising edge RE of the first data ID is formed, the first transistor MP11 and the second transistor MP12 are turned on, and the rising edge of the first node N1 is formed (operation (9)). At this time, the falling edge FE of the logic operation signal MCK1 is formed, and the third transistor MN11 is turned off (operation (10)). If the rising edge RE of the first node N1 is formed, the second data OD1 is delayed for a time by the second inverter IN12, and the falling edge FE of the second data OD1 is formed. At this time, the first clock CK1 is at the logical low level, the slave stage 200 is in a disabled state.

If the rising edge RE of the first clock CK1 is formed, the second transistor MP12 and the third transistor MN11 are turned of and the master stage 100 is disabled. Accordingly, the second data OD1 is kept at the logical low level (operation (11)). At the rising edge RE of the first clock CK1, the slave stage 200 is enabled, and receives and inverts the second data OD1 to output the inverted second data OD1 as the third data OD2. Since the subsequent operation of the semiconductor circuit 1 can be sufficiently expected through an analogy of the above-described contents, the explanation thereof will be omitted.

The operation of the semiconductor circuit 1 according to this embodiment as described above is summarized as follows.

First, after the rising edge RE of the first clock CK1 is formed, the falling edge FE of the first sub-clock Ck2-1 is formed. Accordingly, the master stage 100 is disabled on the basis of a time point T1 in FIG. 3, and the slave stage 200 is enabled on the basis of a time point T2 in FIG. 3.

That is, since the falling edge FE of the first sub-clock CK2-1 is unable to be formed to overlap the rising edge RE of the first clock CK1, enable/disable operations of the master stage 100 and the slave stage 200 are sequentially performed.

If the enable/disable operations of the master stage 100 and the slave stage 200 are not sequentially performed, the first data ID is not output as the third data OD2 to match the clock signal, but data, which has already been stored in the master stage 100 or the slave stage 200, is output as the third data OD2 regardless of the first data ID. Such a malfunction causes the sampling window of the semiconductor circuit 1 (e.g., the flip-flop) to be increased, and thus the operational reliability of the device is deteriorated.

However, in the semiconductor circuit 1, any possible malfunction is intercepted in advance through the above-described configuration, and thus the operational reliability of the semiconductor circuit 1 can be improved.

Further, the size and the symmetry of the sampling window are greatly affected by timing skew of the master stage 100. However, according to the circuit configuration of the semiconductor circuit 1, the timing skew of the master stage 100 can be reduced, and thus the sampling window can be symmetrically formed with a small size.

In the semiconductor circuit 1 as configured above, a low sampling window Tsw_low and a high sampling window Tsw_high have been measured to be about 2 to 5 ps and about 3 to 7 ps, respectively. Accordingly, it can be confirmed that there is almost no time difference between the low sampling window Tsw_low and the high sampling window Tsw_high, and thus the sampling window Tsw is symmetrically formed. As the sampling window Tsw is symmetrically formed, the reliability of the semiconductor 1 can be improved.

On the other hand, the master stage 100 and the slave stage 200 may have different threshold voltages Vt. For example, the threshold voltage of the master stage 100 may be lower than the threshold voltage of the slave stage 200. If the threshold voltage of the master stage 100 is made to be lower than the threshold voltage of the slave stage 200, the sampling window Tsw can be made with a small size. Table 1 below indicates the ratio of power loss to sampling window Tsw in the case where the threshold voltages are different from each other.

TABLE 1

|  | High Vt | Low Vt | Low Vt - High Vt |
|---|---|---|---|
| Tsw | 1 | 0.76 | 0.82 |
| Leakage Power | 1 | 5.78 | 2.3 |

Referring to Table 1, if it is assumed that the sampling window Tsw of the semiconductor circuit 1 is 1 and the power loss of the semiconductor circuit 1 is 1 in the case where both the master stage 100 and the slave stage 200 have the high threshold voltages, the sampling window Tsw is increased 0.76 times and the power loss is increased 5.789 times in the case where both the master stage 100 and the slave stage 200 have the low threshold voltages. Since the circuit can operate at high speed as the threshold voltage is lowered, the sampling window may be decreased. However, since the leakage current is increased to that extent, the power loss is increased 5.78 times.

By making the threshold voltages of the master stage 100 and the slave stage 200 different from each other, the above-described problem can be solved. For example, the threshold voltage of the master stage 100 can be made lower than the threshold voltage of the slave stage 200. In this case, as compared with the case where the semiconductor circuit 1 has the high threshold voltage, the sampling window is increased 0.82 times, and the power loss is increased 2.3 times.

As compared with the case where both the master stage 100 and the slave stage 200 have the low threshold voltages, it can be confirmed that the sampling window is decreased in a similar manner and the power loss is decreased below a half thereof. Accordingly, if the threshold voltage of the master stage 100 is made lower than the threshold voltage of the slave stage 200, the lower loss is minimized, and the sampling window is decreased.

Here, the threshold voltage of the mater stage 100 may mean the threshold voltages of active devices used in the master stage 100, for example, the threshold voltages of the first to third transistors MP11, MP12, and MN11 and the first keeper 41, and the threshold voltage of the slave stage 200 may mean the threshold voltages of active devices used in the slave stage 200, for example, the threshold voltages of the fourth and fifth transistors MN21 and MP21 and the second keeper 42.

Figure 5:
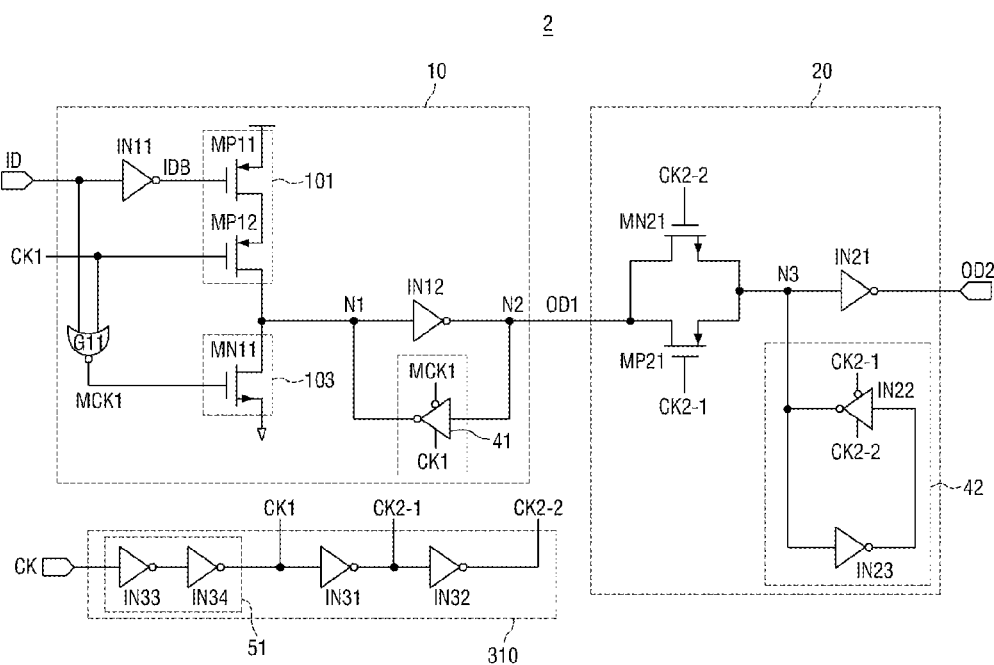
FIG. 5 is a circuit diagram of a semiconductor circuit according to another example embodiment of inventive concepts.
Figure 6:
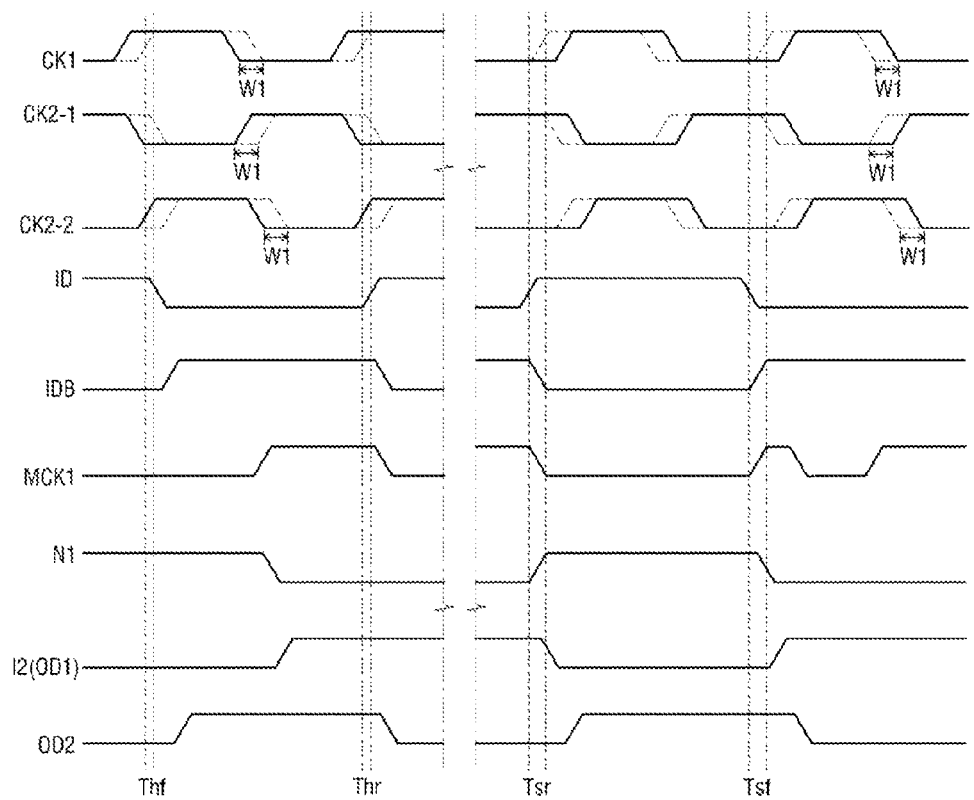
FIG. 6 is a diagram illustrating the operation timing of the semiconductor circuit of FIG. 5.

Referring to FIGS. 5 and 6, a semiconductor circuit according to another embodiment will be described. Explanation of the duplicate contents as described above will be omitted, and explanation will be made around different points between the embodiments.

FIG. 5 is a circuit diagram of the semiconductor circuit 2, and FIG. 6 is a diagram illustrating the operation timing of the semiconductor circuit 2 of FIG. 5.

Referring to FIG. 5, according to the semiconductor circuit 2, unlike the semiconductor circuit 1 of FIG. 2, a clock generating unit 310 additionally includes a first delay unit 51. Specifically, the first delay unit 51 receives a reference clock CK and generates a first clock CK1 through delaying of the reference clock CK for a time. In order to delay the reference clock CK, the first delay unit 51 may include two inverters IN33 and IN34 that are connected in series. The first delay unit 51 may generate the first clock CK1 through inversion of the reference clock Ck twice. A second clock CK2 may be generated using the first clock CK1 as in the clock generating unit 300 of FIG. 2.

Since the clock generating unit 310 includes the first delay unit 51, the phase of the first clock CK1 that is applied to the master stage 100 as illustrated in FIG. 6 can be delayed. If the phase of the first clock CK1 is delayed, rising edges RE and falling edges FE of first data ID and the first clock CK1 can be accurately discriminated, and thus an error of the semiconductor circuit 2 can be prevented. Since the phase of the first clock CK1 is delayed as much as a first size W1, phases of a first sub-clock CK2-1 and a second sub-clock CK2-2, which constitute the second clock CK2, are delayed as much as the first size W1.

Figure 7:
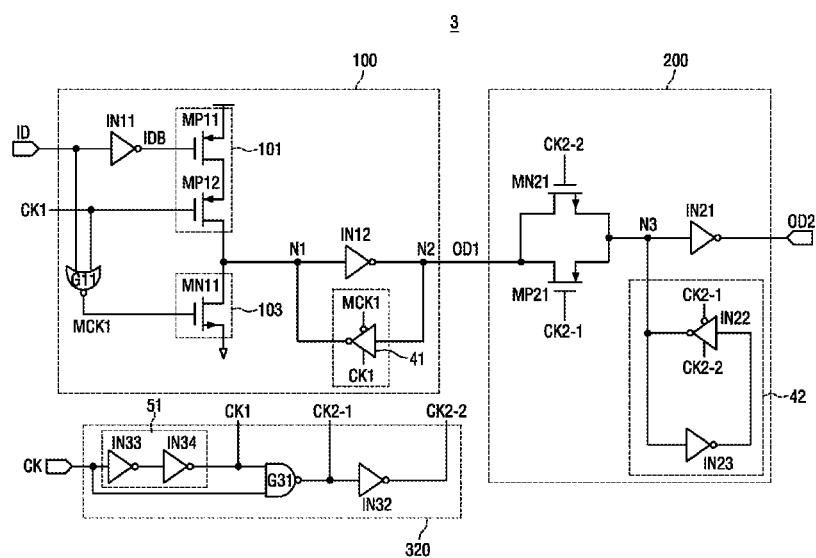
FIG. 7 is a circuit diagram of a semiconductor circuit according to still another example embodiment of inventive concepts.
Figure 8:
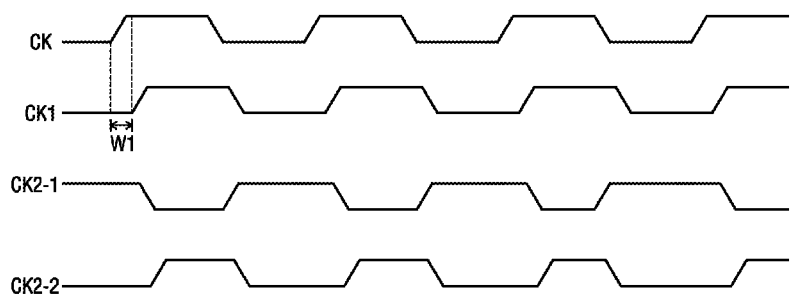
FIG. 8 is a timing diagram of first and second clocks of FIG. 7.

Referring to FIGS. 7 and 8, a semiconductor circuit 3 according to still another example embodiment of inventive concepts will be described. Explanation of the duplicate contents as described above will be omitted, and explanation will be made around different points between the embodiments.

FIG. 7 is a circuit diagram of the semiconductor circuit 3, and FIG. 8 is a timing diagram of first and second clocks of FIG. 7.

Referring to FIG. 7, the semiconductor circuit 3 is different from the semiconductor circuit 2 of FIG. 5 on the point that a clock generating unit 320 has a different configuration. Specifically, in the same manner as the semiconductor circuit 2 of FIG. 5, a first clock CK1 is generated through delaying of a phase of a reference clock CK as much as a first size W1 by a first delay unit 51. However, in the case of generating a first sub-clock CK2-1 using the first clock CK1, a second gate G31 is used instead of a sixth inverter IN31. The second gate G31 may be, for example, a NAND gate. The second gate G31 generates the first sub-clock CK2-1 through performing of a NAND logic operation of the first clock CK1 and the reference clock CK. As illustrated in FIG. 8, the first sub-clock CK2-1 can shorten a time of a logical low level in comparison to the first clock CK1. The slave stage 200 is enabled when the first sub-clock Ck2-1 is at a logical low level and a second sub-clock CK2-2 is at a logical high level, and using the second gate G31, the time when the slave stage 200 is kept in an enabled state can be shortened. If the enable time of the slave stage 200 is shortened, the master stage 100 and the slave stage 200 can be prevented from being simultaneously enabled or disabled. The second sub-clock CK2-2 may be generated through inversion of the first sub-clock CK2-1.

Figure 9:
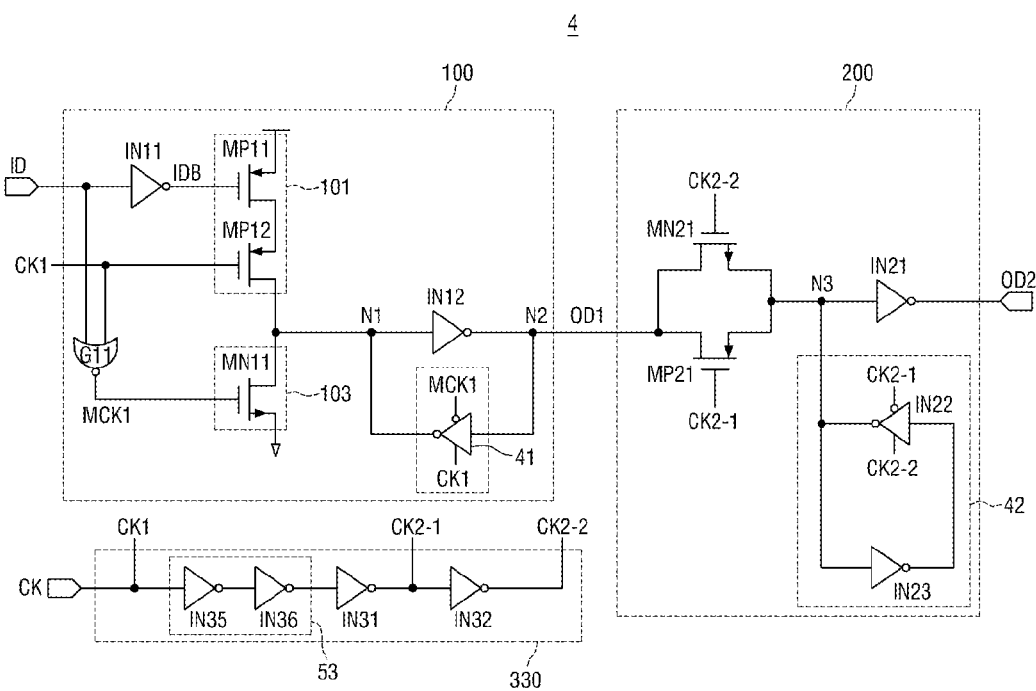
FIG. 9 is a circuit diagram of a semiconductor circuit according to still another example embodiment of inventive concepts.

Referring to FIG. 9, a semiconductor circuit 4 according to still another example embodiment of inventive concepts will be described. Explanation of the duplicate contents as described above will be omitted, and explanation will be made around different points between the embodiments.

FIG. 9 is a circuit diagram of the semiconductor circuit 4.

Referring to FIG. 9, the semiconductor circuit 4 of FIG. 9 is different from the semiconductor circuit 1 of FIG. 2 on the point that a clock generating unit 330 includes a second delay unit 53. The second delay unit 53 may be connected in series to a sixth inverter IN31. The second delay unit 53 may be provided through connection of two inverters IN35 and IN36 in series.

A first clock CK1 is the same as a reference clock CK. A first sub-clock CK2-1 is generated by delaying a phase of the first clock CK1 as much as a first size W1 through the second delay unit 53 and inverting the delayed first clock CK1 through the second delay unit 53. A second sub-clock CK2-2 may be generated through inversion of the first sub-clock CK2-1.

Figure 10:
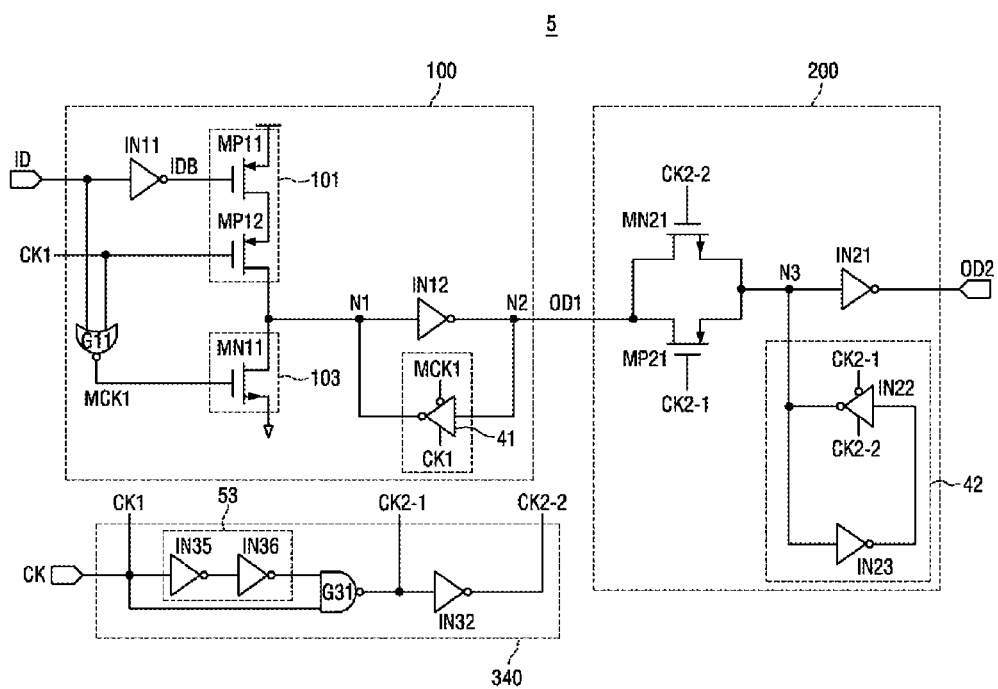
FIG. 10 is a circuit diagram of a semiconductor circuit according to still another example embodiment of inventive concepts.

Referring to FIG. 10, a semiconductor circuit 5 according to still another example embodiment of inventive concepts will be described. Explanation of the duplicate contents as described above will be omitted.

FIG. 10 is a circuit diagram of the semiconductor circuit 5.

Referring to FIG. 10, the semiconductor circuit 5 of FIG. 10 is different from the semiconductor circuit 4 of FIG. 9 on the point that a second gate G31 can substitute for a sixth inverter IN31 in a clock generating unit 340. The second gate G31 may be, for example, a NAND gate. A first clock CK1 may be the same as a reference clock CK. A first sub-clock CK2-1 may be generated by delaying the first clock CK1 through the second delay unit 53 and performing a NAND logic operation of the delayed first clock CK1 and the first clock CK1. A second sub-clock CK2-2 may be generated through inversion of the first sub-clock CK2-1.

Figure 11:
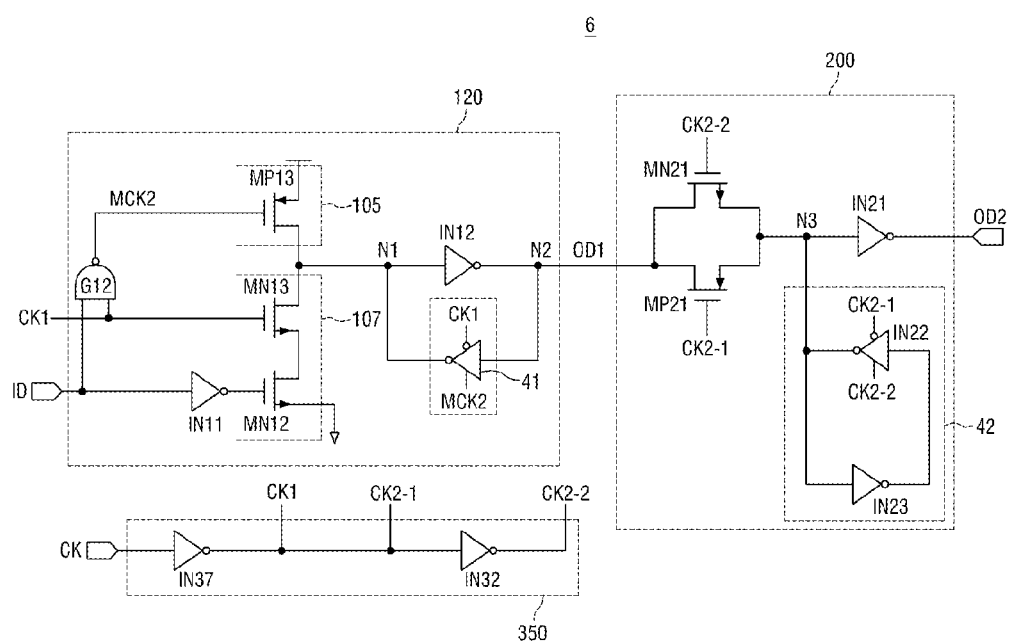
FIG. 11 is a circuit diagram of a semiconductor circuit according to still another example embodiment of inventive concepts.

Referring to FIG. 11, a semiconductor circuit 6 according to still another example embodiment of inventive concepts will be described. Explanation of the duplicate contents as described above will be omitted.

FIG. 11 is a circuit diagram of the semiconductor circuit 6.

Referring to FIG. 11, the semiconductor circuit 6 of FIG. 11 is different from the semiconductor circuit 1 of FIG. 2 on the point of a master slave 120 and a clock generating unit 350.

Specifically, the semiconductor circuit 6 of FIG. 11 includes a first inverter IN11, a third gate G12, a third circuit 105, a fourth circuit 107, a first keeper 41, and a second inverter IN12. The third circuit 105 may be connected to a third voltage, and may include a sixth transistor MP13. The sixth transistor MP13 may be, for example, a PMOS transistor. The sixth transistor MP13 may be gated by a logic operation signal MCK2 that is generated by the third gate G12. A third voltage may be, for example, a power supply voltage. The third circuit 105 may change the level of a first node N1 to a logical high level. That is, the third circuit 105 may change the level of second data OD1 to a logical low level.

The fourth circuit 107 may be connected to a fourth voltage, and may include a seventh transistor MN12 and an eighth transistor MN13. The seventh transistor MN12 and the eighth transistor MN13 may be connected in series, and may be, for example, NMOS transistors. For example, the fourth voltage may be a ground voltage. The fourth circuit 107 may change the level of the first node N1 to a logical low level. That is, the fourth circuit 107 may change the level of second data OD1 to a logical high level.

The seventh transistor MN12 is gated by inverted data IDB of first data ID that is inverted by the first inverter IN11. The eighth transistor MN13 is gated by a first clock CK1.

The third gate G12 may perform a logic operation of the first data ID and the first clock CK1 and may provide a logic operation signal MCk2 to the third circuit 105. The third gate G12 may be, for example, a NAND gate, and may perform a NAND logic operation of the first data ID and the first clock CK1.

The third circuit 105 and the fourth circuit 107 are connected in series, and may be connected to the first node N1. The second inverter IN12 is connected to the first node N1, and inverts a signal of the first node N1 to generate the second data OD1. The first keeper 41 is connected to the first node N1, and may be connected in parallel to the second inverter IN12.

The clock generating unit 350 may include a seventh inverter IN32 and an eighth inverter IN37. The eighth inverter IN37 generates a first clock CK1 through inversion of a reference clock Ck. A first sub-clock CK2-1 may be the same as the first clock CK1, and a second sub-clock CK2-2 may be generated through inversion of the first sub-clock CK2-1 by the seventh inverter IN32.

A slave stage 200 of the semiconductor circuit 6 of FIG. 11 is the same as that of the semiconductor circuit 1 of FIG. 1.

The semiconductor circuit 6 of FIG. 11 is a circuit that is formed through inversion of the semiconductor circuit 1 of FIG. 1. In other words, the semiconductor circuit 1 of FIG. 1 operates in the same manner as the semiconductor circuit 6 of FIG. 11, but the circuit configuration thereof is in contrast to that of the semiconductor circuit 6 of FIG. 11. Specifically, the third gate G12 is formed of a NAND gate instead of a NOR gate, and the third circuit 105 that is gated by the third gate G12 is connected to a power supply voltage and includes a PMOS transistor. The fourth circuit 107 includes two NMOS transistors and is connected to a ground voltage. Further, the first clock CK1 that is provided to the master slave 120 is generated through inversion of the reference clock CK.

Since it can be easily analogized from the above-described contents that the semiconductor circuit 6 of FIG. 11 has the circuit configuration that is different from the circuit configuration of the semiconductor circuit 1 of FIG. 1, but operates in the same manner as the semiconductor circuit 1 of FIG. 1, the explanation of the operation of the semiconductor circuit 6 of FIG. 11 will be omitted.

Figure 12:
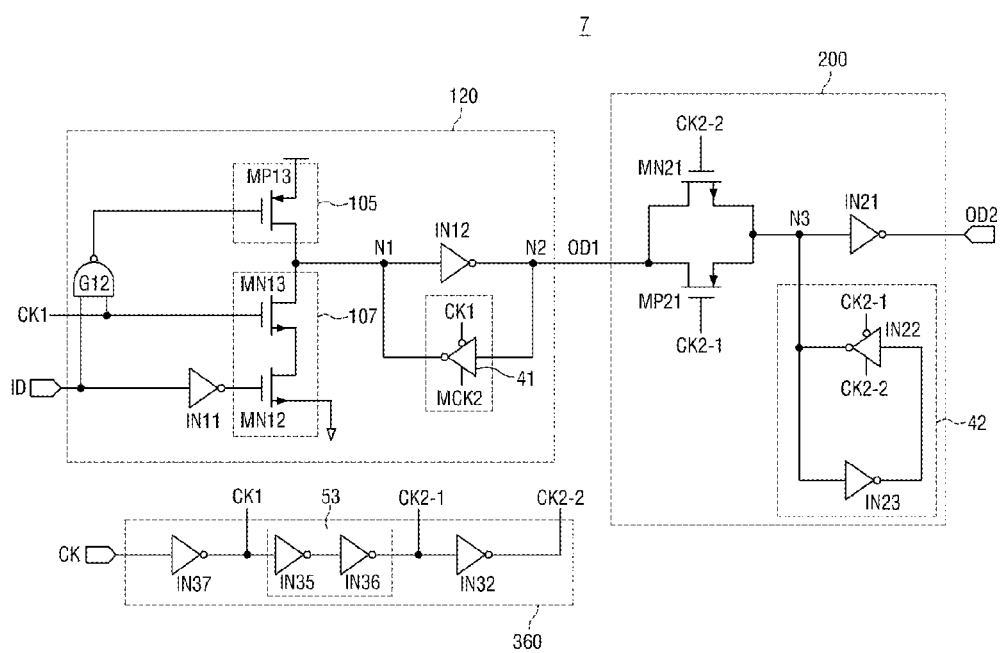
FIG. 12 is a circuit diagram of a semiconductor circuit according to still another example embodiment of inventive concepts.

Referring to FIG. 12, a semiconductor circuit 7 according to still another example embodiment of inventive concepts will be described. Explanation of the duplicate contents as described above will be omitted.

FIG. 12 is a circuit diagram of the semiconductor circuit 7.

The semiconductor circuit 7 of FIG. 12 is different from the semiconductor circuit 6 of FIG. 11 on the point of a clock generating unit 360.

Referring to FIG. 12, the clock generating unit 360 includes a second delay unit 53. That is, a first clock CK1 is generated through inversion of a reference clock CK, and a first sub-clock CK2-1 is generated through delaying of a phase of the first clock Ck1 by the second delay unit 53. A second sub-clock CK2-2 may be generated through inversion of the first sub-clock CK2-1. The second delay unit 53 may be formed through connection of two inverters IN35 and IN36 in series.

Figure 13:
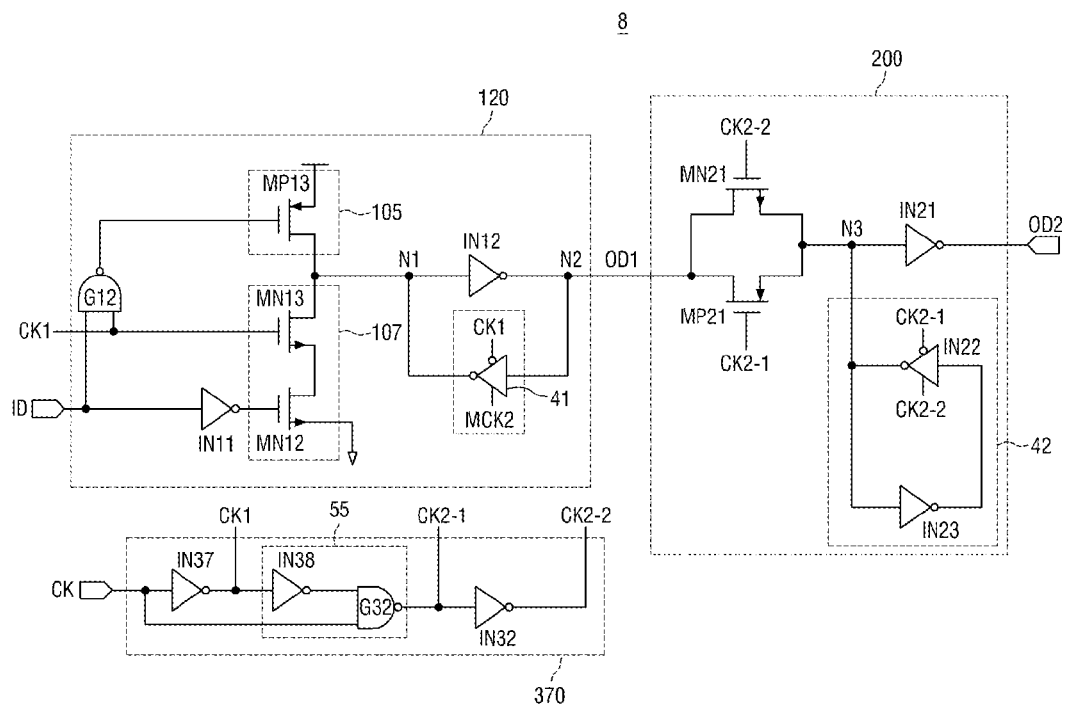
FIG. 13 is a circuit diagram of a semiconductor circuit according to still another example embodiment of inventive concepts.

Referring to FIG. 13, a semiconductor circuit 8 according to still another example embodiment of inventive concepts will be described. Explanation of the duplicate contents as described above will be omitted.

FIG. 13 is a circuit diagram of the semiconductor circuit 8.

The semiconductor circuit 8 of FIG. 13 is different from the semiconductor circuit 6 of FIG. 11 on the point of a clock generating unit 360. Specifically, referring to FIG. 13, the clock generating unit 360 may include a third delay unit 55. The third delay unit 55 may include a ninth inverter IN38 and a third gate G12.

A first clock CK1 is generated through inversion of a reference clock CK by an eighth inverter IN37. Further, a first sub-clock CK2-1 is generated through performing of a logic operation of the reference clock CK and a value that is obtained by inverting the first clock CK1 through the third gate G12. A second sub-clock CK2-2 may be generated through inversion of the first sub-clock CK2-1 by a seventh inverter IN32. For example, the third gate G12 may be a NAND gate, and may generate the first sub-clock CK2-1 through performing of a NAND logic operation of the reference clock CK and a value that is obtained by inverting the first clock CK1.

Figure 14:
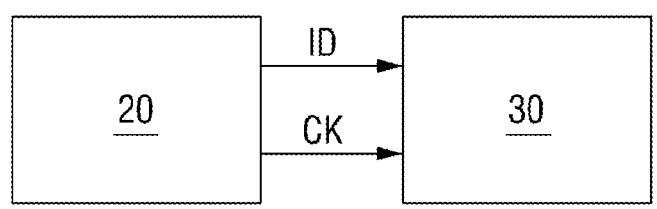
FIG. 14 is a block diagram of a semiconductor system including a semiconductor circuit according to some example embodiments of inventive concepts.

Referring to FIG. 14, a semiconductor system 10 that includes a semiconductor circuit according to some example embodiments of inventive concepts will be described.

FIG. 14 is a block diagram of the semiconductor system 10.

The semiconductor system 10 may include a transmitter 20 and a receiver 30. The transmitter 20 may transmit first data ID to the receiver 30 using a reference clock CK. The receiver may receive the first data ID, and may process or perform sampling of the first data ID using the reference clock CK. One of the semiconductor circuits 1 to 8 as described above may be formed at an input terminal of the receiver 30. The input terminal of the receiver 30 may receive the first data ID and the reference clock CK and provide third data OD2 into the receiver 30.

Here, the semiconductor system 10 may be, for example, a processor, but is not limited thereto. The semiconductor system 10 may be applied to a semiconductor device that is used to transmit data.

Figure 15:
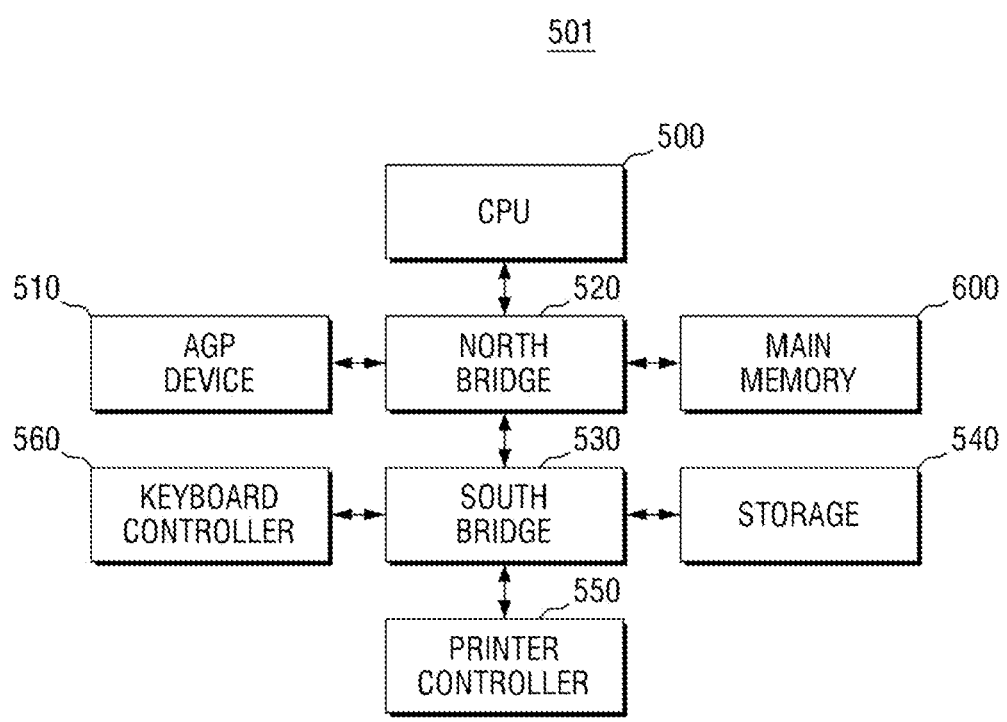
FIG. 15 is a block diagram illustrating the configuration of a computing system that can adopt a semiconductor circuit according to some example embodiments of inventive concepts.

Referring to FIG. 15, a computing system that can adopt the semiconductor circuits 1 to 8 as described above will be described.

FIG. 15 is a block diagram illustrating the configuration of the computing system 501.

Referring to FIG. 15, the computing system 501 includes a central processing unit 500, an AGP (Accelerated Graphics Port) device 510, a main memory 600, a storage (e.g., SSD or HDD) 540, a north bridge 520, a south bridge 530, a keyboard controller 560, and a printer controller 550.

The computing system 501 illustrated in FIG. 15 may be a personal computer or a notebook computer. However, inventive concepts are not limited thereto, and exemplification of the computing system 501 may be modified without limit.

In the computing system 501, the central processing unit 500, the AGP device 510, and the main memory 530 may be connected to the north bridge 520. However, the present inventive concepts are not limited thereto, and the north bridge 520 may be modified to be included in the central processing unit 500.

The AGP may be bus standards that enable three-dimensional (3D) graphic expressions to be rapidly implemented, and the AGP device 510 may include a video card that reproduces monitor images.

The central processing unit 500 may perform various kinds of logic operations that are required to drive the computing system 101, and may perform an OS and application programs. At least one of the semiconductor circuits 1 to 8 may be adopted as a part of the central processing unit 500.

The main memory 600 may load data that is required to perform the operation of the central processing unit 500 from the storage 540 to store the loaded data.

The storage 540, the keyboard controller 560, the printer controller 550, and various kinds of peripheral devices (not illustrated) may be connected to the south bridge 530.

The storage 540 is a large-capacity data storage that stores file data and the like, and may be implemented by, for example, HDD or SSD. However, inventive concepts are not limited to such exemplifications.

Further, the computing system 501 has a structure in which the storage 540 is connected to the south bridge 530, but inventive concepts are not limited thereto. The structure may be modified in a manner that the storage 540 is connected to the north bridge 520 or is directly connected to the central processing unit 500.

Figure 16:
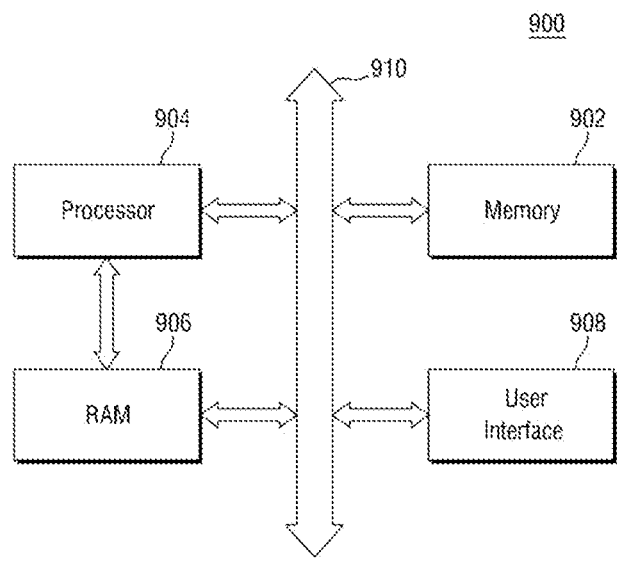
FIG. 16 is a block diagram illustrating the configuration of an electronic system that can adopt a semiconductor circuit according to some example embodiments of inventive concepts.

Next, referring to FIG. 16, an electronic system 900 that can adopt the semiconductor circuits 1 to 8.

FIG. 16 is a block diagram illustrating the configuration of the electronic system 900 that can adopt the semiconductor circuits 1 to 8.

Referring to FIG. 16, an electronic system 900 may include a memory system 902, a processor 904, a RAM 906, and a user interface 908.

The memory system 902, the processor 904, the RAM 906, and the user interface 908 may perform data communication with each other using a bus 910.

The processor 904 may serve to execute programs and to control the electronic system 900, and the RAM 906 may be used as an operating memory of the processor 904. The processor 904 may include at least one of the semiconductor circuits 1 to 8 as a part of the constituent elements. The processor 904 and the RAM 906 may be implemented to be packaged as one semiconductor device or a semiconductor package.

The user interface 908 may be used to input/output data to/from the electronic system 900.

The memory system 902 may store codes for the operation of the processor 904, data processed by the processor 904, or data input from an outside. The memory system 902 may include a separate controller for the operation thereof, and may be configured to additionally include an error correction block. The error correction block may be configured to detect and correct an error of the data stored in the memory system 902 using an error correction code (ECC).

The memory system 902 may be integrated into one semiconductor device. Exemplarily, the memory system 902 may be integrated into one semiconductor device to configure a memory card. For example, the memory system 902 may be integrated into one semiconductor device to configure a memory card, such as a PC card (PCMCIA (Personal Computer Memory Card International Association)), a compact flash (CF) card, a smart media card (SM or SMC), a memory stick, a multimedia card (MMC, RS-MMC, MMC-micro), a SD card (SD, miniSD, microSD, or SDHC), a universal flash storage device (UFS), or the like.

Figure 17:
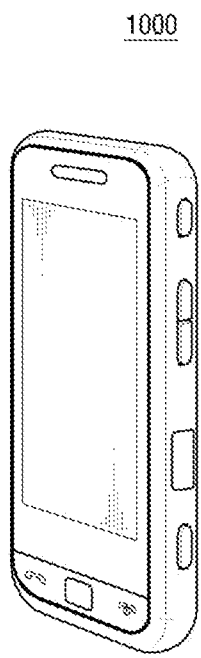
FIG. 17 is a view illustrating an application example of the electronic system of FIG. 16 to a smart phone.

The electronic system 900 illustrated in FIG. 16 may be applied to electronic control devices of various electronic appliances. FIG. 17 is a view illustrating an application example of the electronic system of FIG. 16 to a smart phone. In the case where the electronic system 900 (in FIG. 16) is applied to a smart phone 1000, at least one of the semiconductor circuits 1 to 8 may be adopted as a partial constituent element of an AP (Application Processor).

In addition, the electronic system 900 (in FIG. 16) may be provided as one of various constituent elements of electronic devices, such as a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

Although example embodiments of inventive concepts have been described for illustrative purposes, those skilled in the art will appreciate that various modifications, additions and substitutions are possible, without departing from the scope and spirit of inventive concepts as disclosed in the accompanying claims.

What is claimed is:

1. A flip-flop comprising:
a first inverter configured to invert first data;
first and second transistors connected to each other in series and configured to receive the inverted first data and a first clock, respectively;
a first gate configured to perform a logic operation on the first data and the first clock;
a third transistor configured to receive an output of the first gate, the second transistor and the third transistor being connected to a first node; and
a clock generating unit configured to receive a reference clock and generate the first clock and a second clock, wherein the second clock includes first and second sub-clocks, the second sub-clock is an inversion of the first sub-clock and the clock generating unit is configured to generate the first sub-clock by performing a NAND logic operation on the reference clock and the first clock.

2. The flip-flop of claim 1, wherein the clock generating unit comprises:
a first delay unit configured to delay a phase of the first clock, and generate the second clock using the delayed first clock.

3. The flip-flop of claim 2, wherein the first clock and the reference clock are the same.

4. The flip-flop of claim 1, wherein the clock generating unit is configured to generate the first clock by delaying a phase of the reference clock, and generate the second clock using the first clock.

5. The flip-flop of claim 1, further comprising:
a keeper circuit connected to the first node.

6. A semiconductor circuit comprising:
a master circuit and a slave circuit configured to receive a first clock and a second clock, respectively, the first clock and the second clock having different phases,
wherein the master circuit includes,
a first transistor, a second transistor, and a third transistor connected in series between a first voltage terminal and a second voltage terminal,
a first inverter configured to invert input data and gate the first transistor,
a first gate configured to gate the third transistor, the first gate configured to perform a logic operation on the input data and the first clock, and the second transistor is configured to receive the first clock, and
a clock generating unit configured to receive a reference clock and generate the first clock and a second clock, the second clock includes first and second sub-clocks, the second sub-clock is an inversion of the first sub-clock and the clock generating unit is configured to generate the first sub-clock by performing a NAND logic operation on the reference clock and the first clock.

7. The semiconductor circuit of claim 6, wherein a threshold voltage of the master circuit is lower than a threshold voltage of the slave circuit.

8. The semiconductor circuit of claim 6, wherein the first transistor is connected to the first voltage terminal, the third transistor is connected to the second voltage terminal, and the second transistor is between the first transistor and the third transistor.

9. The semiconductor circuit of claim 8, wherein the first transistor and the second transistor are configured to change the input data to a first level, and the third transistor is configured to change the input data to a second level.

10. The semiconductor circuit of claim 6, further comprising:
a keeper circuit connected between the second transistor and the third transistor.

11. The semiconductor circuit of claim 6, wherein the logic operation is a NOR logic operation.

12. The semiconductor circuit of claim 8, wherein a first voltage of the first voltage terminal is a power supply voltage, and a second voltage of the second voltage terminal is a ground voltage.

13. A semiconductor system comprising:
a transmitter configured to transmit first data using a reference clock; and
a receiver configured to receive the first data,
wherein the receiver includes,
a clock generating unit configured to generate a first clock and a second clock having different phases using the reference clock,
a master circuit configured to receive the first data and the first clock and output second data, and
a slave circuit configured to receive the second data and the second clock and output third data,
the master circuit includes,
a first circuit between a first voltage terminal and a first node to change the second data to a first level, the first circuit is configured to receive inverted first data and the first clock,
a second circuit between the first node and a second voltage terminal to change the second data to a second level, the second circuit is configured to operate according to a logic operation signal of the first data and the first clock, and
a clock generating unit configured to receive a reference clock and generate the first clock and a second clock, the second clock includes first and second sub-clocks, and the second sub-clock being an inversion of the first sub-clock and the clock generating unit is configured to generate the first sub-clock by performing a NAND logic operation on the reference clock and the first clock.

* * * * *